(12) United States Patent
Itaya

(10) Patent No.: US 6,271,700 B1
(45) Date of Patent: Aug. 7, 2001

(54) SEMICONDUCTOR INTEGRATED CIRCUIT HAVING SCAN PATH

(75) Inventor: Koichi Itaya, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/656,421

(22) Filed: Sep. 6, 2000

(30) Foreign Application Priority Data

Sep. 14, 1999 (JP) .................................................. 11-259821

(51) Int. Cl.[7] .................................................. H03K 3/289
(52) U.S. Cl. .......................... 327/202; 327/203; 714/726; 714/729
(58) Field of Search .................................... 327/199, 202, 327/203; 714/724, 726, 727, 728, 729, 731, 699; 324/73.1

(56) References Cited

U.S. PATENT DOCUMENTS 4,493,077 * 1/1985 Agrawal et al. ..................... 714/731
5,757,203 * 5/1998 Brown .................................. 324/765

* cited by examiner

Primary Examiner—Kenneth B. Wells
Assistant Examiner—Paul Dinh
(74) Attorney, Agent, or Firm—Staas & Halsey LLP

(57) ABSTRACT

A logic circuit includes a combinational circuit 11 and a sequential circuit, outputs D0 to D3 of the combinational circuit 11 are provided to the respective data inputs D of flip-flops 12 to 15 of the sequential circuit through respective multiplexers 22 to 25, and the flip-flops 12 to 15 are cascaded through the multiplexers 22 to 25 to construct a scan path. AND gates 32 to 35 are provided for preventing changes in outputs of the flip-flops 12 to 15 from being transmitted to the combinational circuit 11 when the scan mode signal *SM is active, whereby the combinational circuit 11 is kept inoperative when data is serially transferred on the scan path consisting of the D flip-flops 12 to 15, an inverter 30 and the multiplexers 22 to 25.

4 Claims, 12 Drawing Sheets

SEMICONDUCTOR INTEGRATED CIRCUIT HAVING SCAN PATH

BACKGROUND OF THE INVENTION

1. Field of the Invention

The present invention relates to a semiconductor integrated circuit employing a scan path method for facilitating a test.

2. Description of the Related Art

A scale of a semiconductor integrated circuit has increased in company with progress toward higher integration and higher functionality thereof, with the result that the number of test patterns for use in detection of defects becomes immensely large. In order to achieve a higher defect detection rate with a smaller number of test patterns, the scan path method has been employed.

FIG. 12 shows a prior art semiconductor integrated circuit 10 employing this method.

A logic circuit in a circuit 10 includes a combinational circuit 11 and a sequential circuit, and the sequential circuit includes D flip-flops 12 to 15. In FIG. 12, for simplicity of description, there is shown a case where the number of flip-flops is 4. Internal output signals D0 to D3 of the combinational circuit 11 are provided to the respective data inputs D of the D flip-flops 12 to 15, and outputs of the D flip-flops 12 to 15 are returned back to the combinational circuit 11.

In order to make a scan path effective only in a scan mode, multiplexers 22 to 25 are provided in a correspondence with the respective D flip-flops 12 to 15, and the internal output signals D0 to D3 of the combinational circuit 11 are provided to the respective data inputs D of the D flip-flops 12 to 15 through first inputs to the outputs of the respective multiplexers 22 to 25. To the second inputs of the respective multiplexers 22 to 25, a scan-in signal SIN and non-inverted outputs Q of the D flip-flops 12 to 14, respectively, are provided. To the selection control inputs of the multiplexers 22 to 25, a scan mode signal *SM is provided.

In a normal operating mode, the scan mode signal *SM is set high and the internal output signals D0 to D3 are selected by the multiplexers 22 and 25, which makes a scan path ineffective.

In the scan mode, the scan mode signal *SM is set low and the scan-in signal SIN and output signals of the D flip-flops 12 to 14 are selected by the respective multiplexers 22 to 25, which makes the scan path effective. The scan-in signal SIN is transferred through the scan path in synchronism with a clock CLK provided to the clock inputs CK of the D flip-flops 12 to 15. After this transfer, to the combinational circuit 11, patterns of input signals I1 to In are provided with the scan mode signal *SM being set high, one pulse of the clock CLK is provided, and a pattern consisting of the output signals 01 to Om of the circuit 11 and the contents of the D flip-flops 12 to 15 are compared with an expected pattern. The contents of the D flip-flops 12 to 15 are taken out as a serial scan-out signal SOUT from the non-inverted output Q of the D flip-flop 15 through an output buffer circuit 30 by providing pulses of the clock CLK.

In the scan mode, when pulses of the clock CLK are provided and the contents of the D flip-flops 12 to 15 are serially read out, varying outputs of the D flip-flops 12 to 15 are also provided to the combinational circuit 11. Thereby, not only the D flip-flops 12 to 15 and the output buffer circuit 30, but also the combinational circuit 11 operate. For this reason, the D flip-flops 12 to 15 are required to be fabricated with transistors of large size so that no malfunction occurs because of shortage of drive capability of the scan path.

However, since a scan path becomes ineffective in the normal operating mode, if this requirement is met just to perform a temporary test, it causes power consumption to increases more than necessary not only in the scan mode but also in the normal operating mode.

Further, in simulation for verification of the test circuit (the scan path), the combinational circuit 11 operates when the contents of the D flip-flops 12 to 15 are serially taken out to the outside, which causes a time of simulation to be longer.

SUMMARY OF THE INVENTION

Accordingly, it is an object of the present invention to provide such a semiconductor integrated circuit that power consumption can be decreased, drive capability of a scan path required for a normal operation can be ensured, and further a time of simulation for verification of a test circuit can be decreased.

In one aspect of the present invention, there is provided a semiconductor integrated circuit comprising a logic circuit, the logic circuit including a combinational circuit and a sequential circuit, the sequential circuit including a plurality of flip-flops and having normal and scan paths made selectively effective by a scan mode signal, the normal and scan paths being constructed in such a way that, when the scan mode signal is inactive, the flip-flops receive output data of the combinational circuit through respective multiplexers on input sides or in input stages of the flip-flops, and when the scan mode signal is active, the flip-flops are cascaded through the multiplexers to form a shift register, the semiconductor integrated circuit further comprising: a gate circuit for preventing an output of at least one of the flip-flops from being transmitted to the combinational circuit when the scan mode signal is active.

With this aspect of the present invention, when the scan mode signal is active, the gate circuit is closed and its output remains unchanged even if a shift operation is performed on the scan path and therefore, power consumption in the combinational circuit can be decreased. Further, a drive capability of the scan path can be ensured even if the flip-flop whose output is connected to the gate circuit is configured with transistors having a smaller size than the prior art, thereby enabling decrease in power consumption not only in the scan mode, but also in the normal operating mode. Still further, in a simulation for verification of the test circuit (the scan path), a portion receiving the output of the gate circuit in the combinational circuit does not operate, therefore a time of simulation can be decreases.

Other aspects, objects, and the advantages of the present invention will become apparent from the following detailed description taken in connection with the accompanying drawings.

DESCRIPTION OF THE PREFERRED EMBODIMENTS

Figure 1:
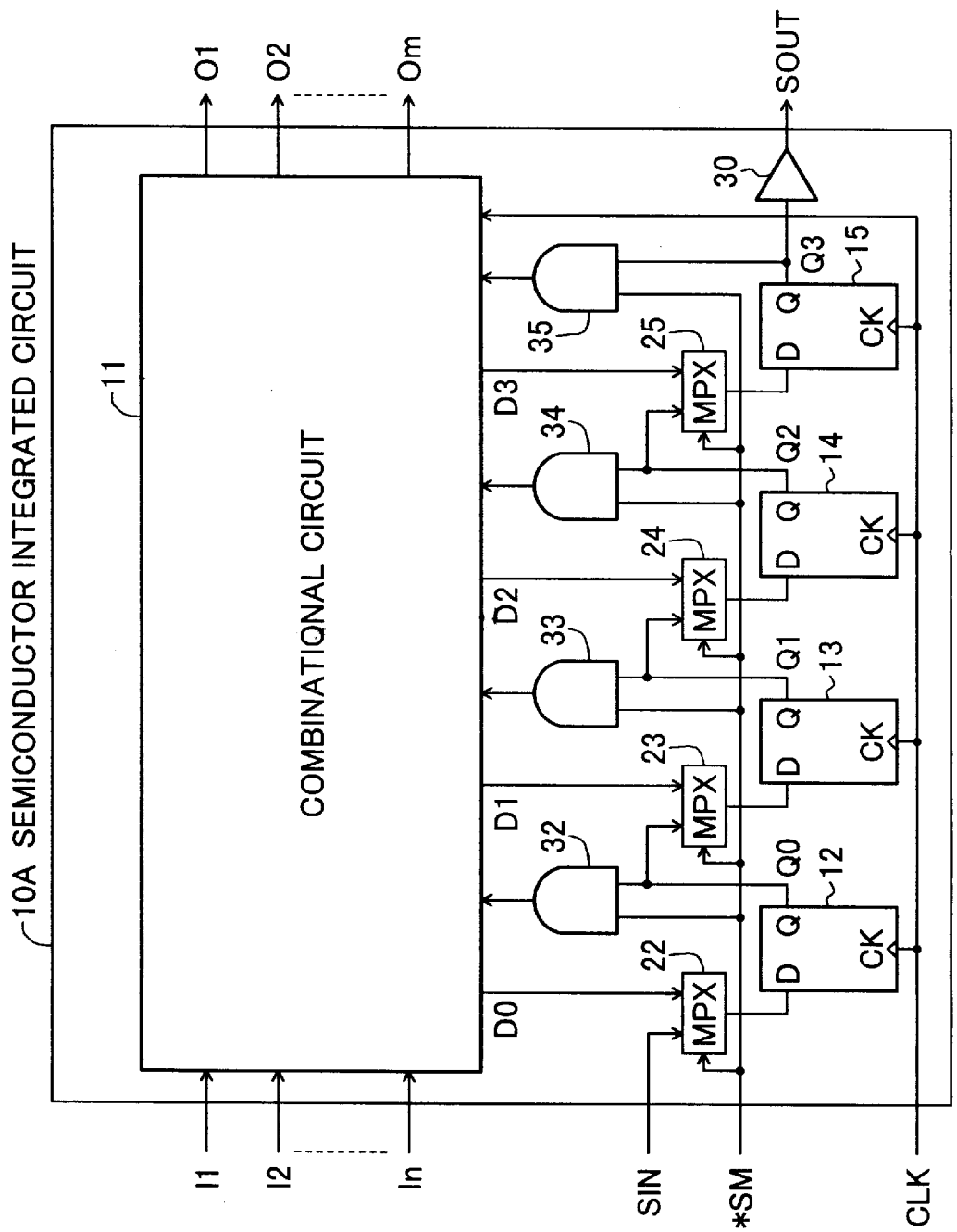
FIG. 1 is a diagram showing a semiconductor integrated circuit employing a scan path method of a first embodiment according to the present invention.

Referring now to the drawings, wherein like reference characters designate like or corresponding parts throughout several views, preferred embodiments of the present invention are described below. A signal which is active low will be denoted with adding * to a reference character.

First Embodiment

FIG. 1 shows a semiconductor integrated circuit 10A employing a scan path method of a first embodiment according to the present invention. In FIG. 1, for simplicity of description, there is shown a case where the number of flip-flops of a sequential circuit is 4 (this applies to FIGS. 2 and 4 described later).

The output signals Q0 to Q3 of D flip-flops 12 to 15 are provided to a combinational circuit 11 through AND gates 32 to 35. To the other inputs of the AND gates 32 to 35, a scan mode signal *SM is commonly provided.

Figure 12:
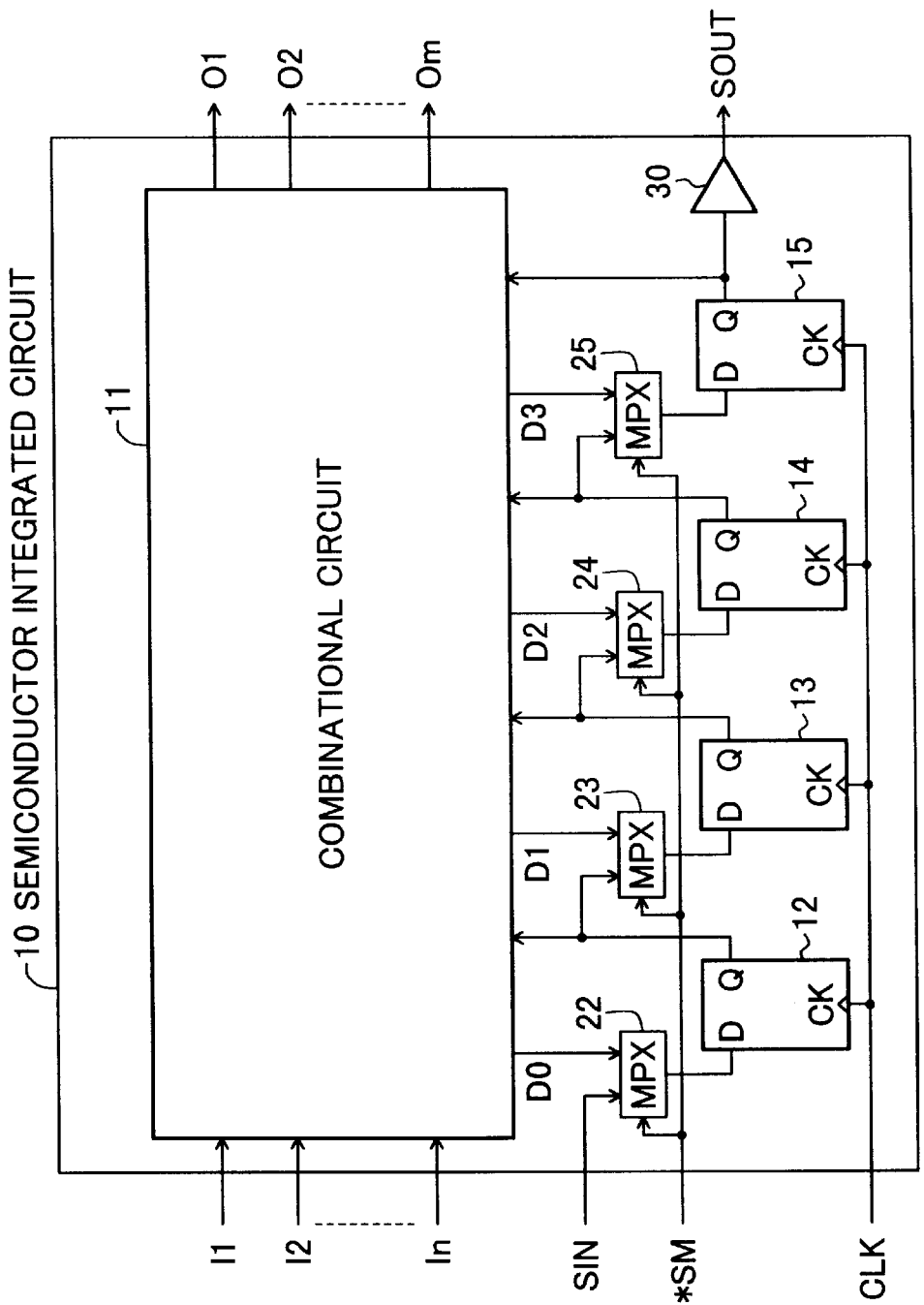
FIG. 12 is a diagram showing a prior art semiconductor integrated circuit employing a scan path method.

The other points in configuration are the same as that of FIG. 12.

In a normal operating mode, the scan mode signal *SM is set high and thereby, on one hand, data D0 to D3 from the combinational circuit 11 are selected by the respective multiplexers 22 to 25 and on the other hand, the AND gates 32 to 35 are opened to perform the same operations as that in the case of FIG. 12.

In a scan mode, the scan mode signal *SM is set low and thereby, a scan-in signal SIN, the signals Q0 to Q2 are selected by the respective multiplexers 22 to 25 and a scan path (a shift register) consisting of the D flip-flops 12 to 25 becomes effective. At this time, since the AND gates 32 to 35 are closed and the outputs of the AND gates 32 to 35 are kept low, the outputs of the D flip-flops 12 to 15 are not sent to the combinational circuit 11 even if a shift operation is performed by the clock CLK. Therefore the combinational circuit 11 does not change if its input signals I1 to IN remain unchanged.

For this reason, a drive capability of the scan path required for the normal operation can be ensured even when the D flip-flops 12 to 15 have transistors of a smaller size than in the prior art. Further, with the smaller size of transistors than the prior art, power consumption in not only the scan mode but also the normal operating mode can be decreased. In addition, in simulation for verification of the test circuit (the scan path), since the combinational circuit 11 does not operate, it is possible to reduce a time of the simulation.

Second Embodiment

Figure 2:
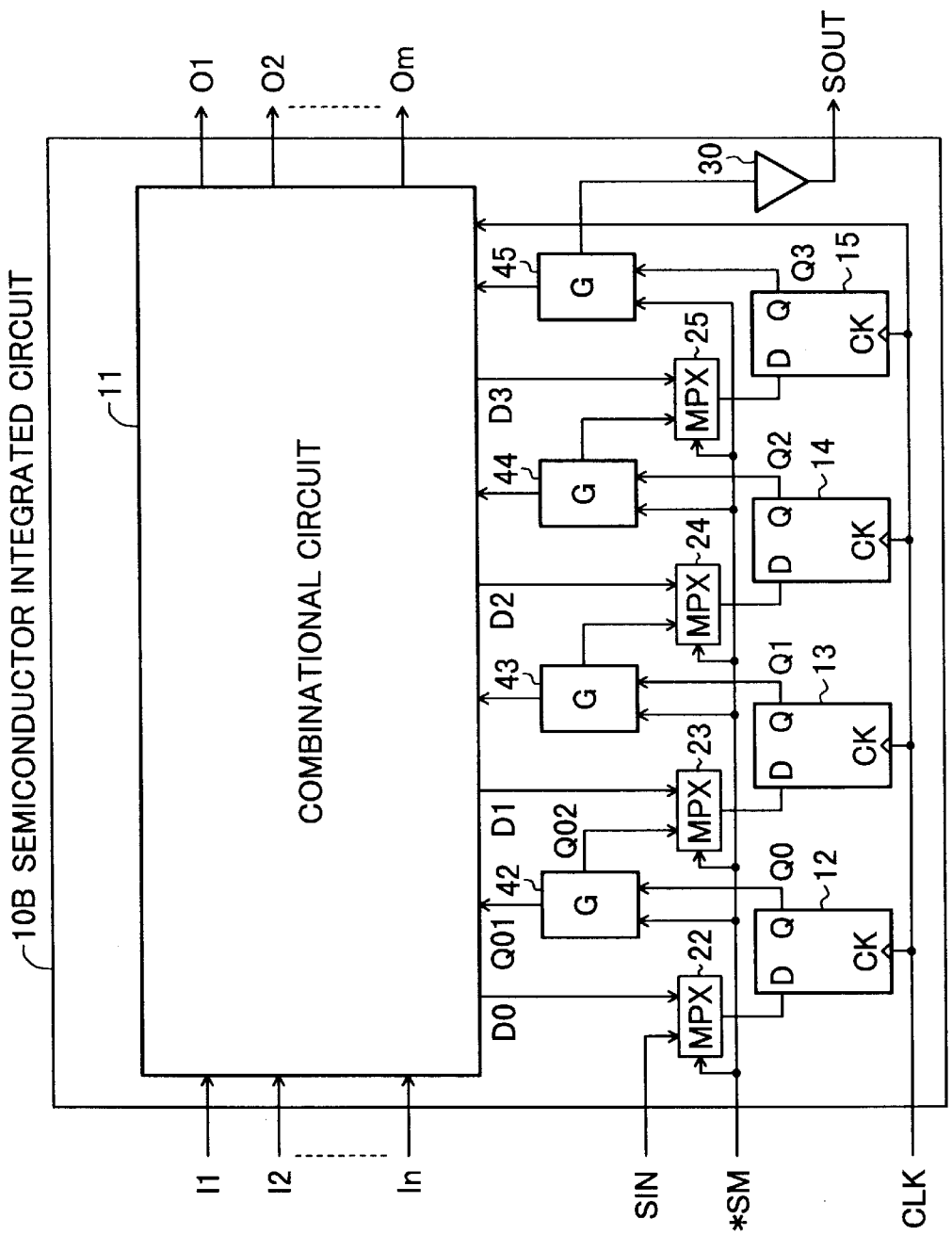
FIG. 2 is a diagram showing a semiconductor integrated circuit employing a scan path method of a second embodiment according to the present invention.

FIG. 2 shows a semiconductor integrated circuit 10B employing a scan path method of a second embodiment according to the present invention.

In this circuit, gate circuits 42 to 45 having the same configuration as one another are employed instead of the AND gates 32 to 35 of FIG. 1, the output signals Q0 to Q3 of the D flip-flops 12 to 15 are provided to first inputs of the multiplexers 23 to 25 and the output buffer circuit 30, respectively, through respective gate circuits 42 to 45.

Figure 3:
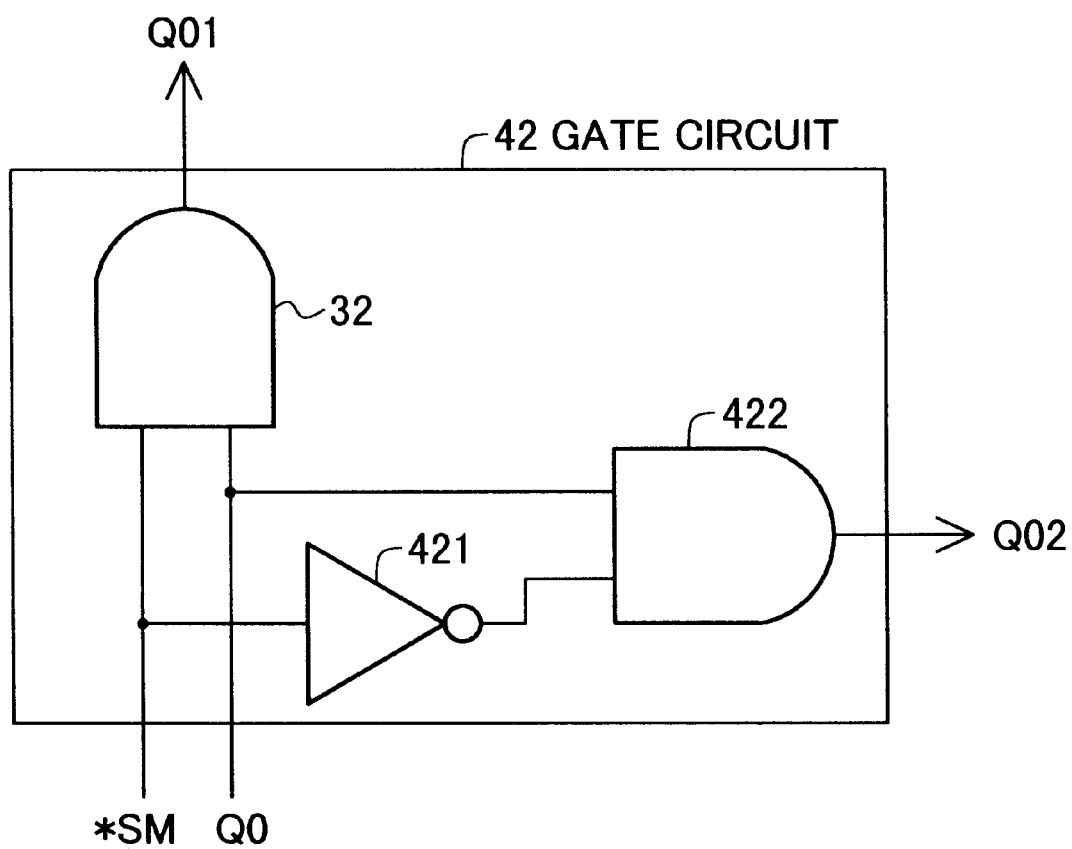
FIG. 3 is a logic circuit diagram showing an embodiment of the gate circuit of FIG. 2.

FIG. 3 is a logic circuit diagram showing an embodiment of the gate circuit 42.

The gate circuit 42 includes an AND gate 32 having the same function as the AND gate 32 of FIG. 1, an inverter 421 inverting the scan mode signal *SM, and an AND gate 422 receiving an output of the inverter 421 and the signal Q0. An output of the AND gate 422 is provided to a first input of the multiplexer 23 of FIG. 2 as the signal Q02.

The other points in configuration are the same as that of FIG. 1.

In the normal operating mode, the scan mode signal *SM is set high and thereby, the AND gate 32 is opened and the AND gate 422 is closed. Accordingly, useless power consumption in the sequential circuit is prevented since outputs from the gate circuits 42 to 45 to the multiplexers 23 to 25 and the output buffer circuit 30 do not change when pulses of the clock CLK are provided to the clock inputs CK of the D flip-flops 12 to 15.

In the scan mode, the scan mode signal *SM is set low and thereby, the AND gate 32 is closed while the AND gate 422 is opened. Accordingly, the same operations as that in the first embodiment are performed.

Third Embodiment

Figure 4:
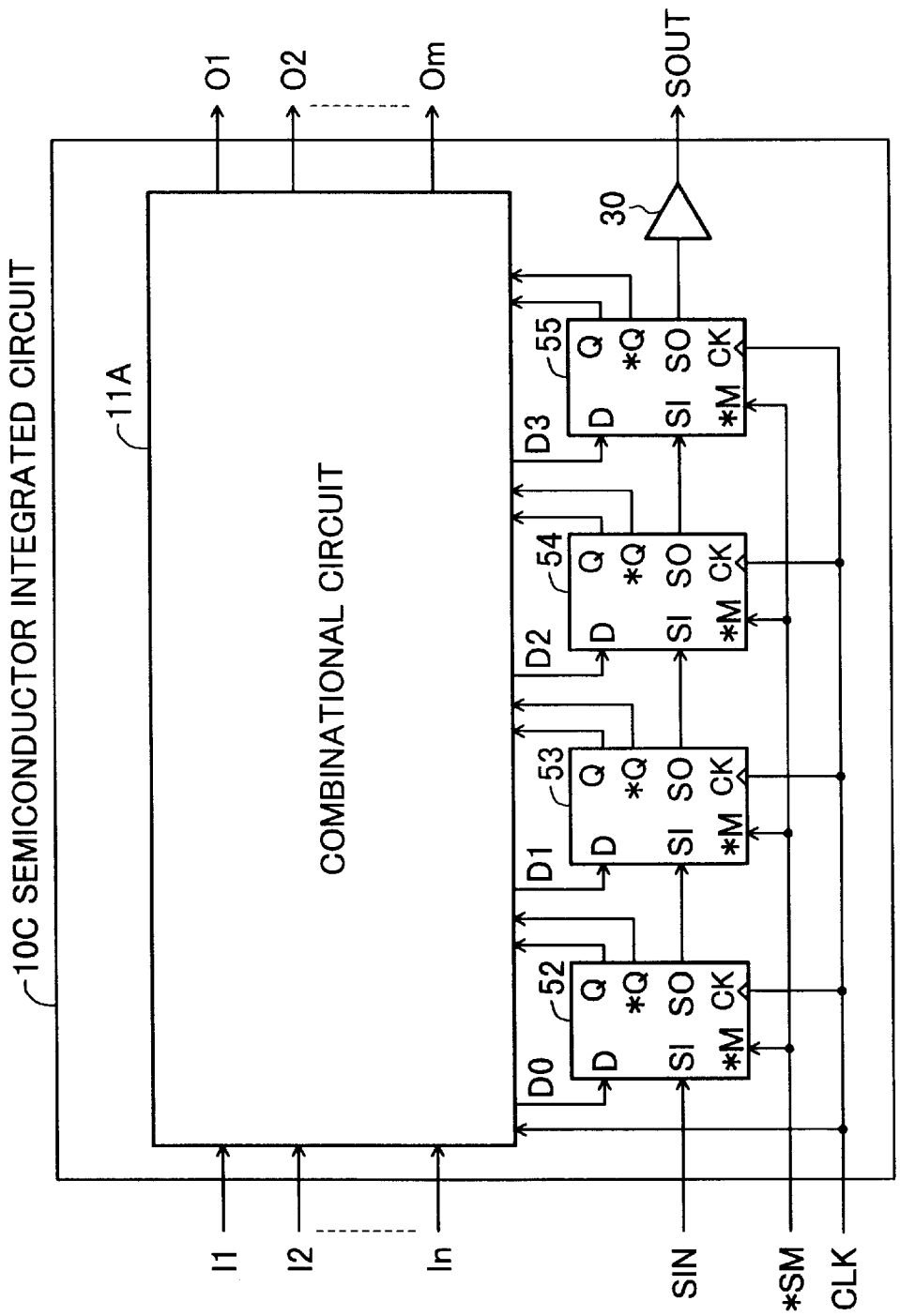
FIG. 4 is a diagram showing a semiconductor integrated circuit employing a scan path method of a third embodiment according to the present invention.

FIG. 4 shows a semiconductor integrated circuit 10C employing a scan path method of a third embodiment according to the present invention.

In this circuit, double-path flip-flops 52 to 55 are incorporated instead of the D flip-flops 12 to 15, the multiplexers 22 to 25 and the AND gates 32 to 35 of FIG. 1. The double-path flip-flops 52 to 55 have the same configuration as one another and, for example, the double-path flip-flop 52 includes the D flip-flop 12, the multiplexer 22 and the AND gate 32 of FIG. 1.

Figure 5:
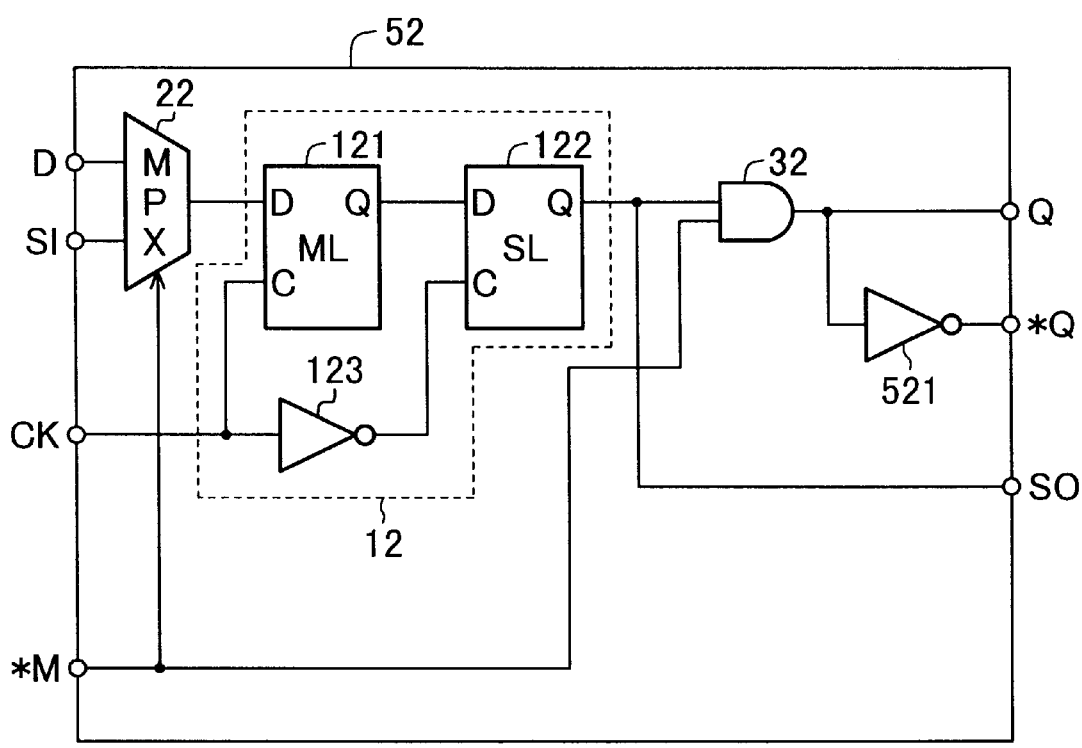
FIG. 5 is a logic circuit diagram showing an embodiment of the double-path flip-flop of FIG. 4.

FIG. 5 is an embodiment of the double-path flip-flop 52.

The D flip-flop 12 in the double-path flip-flop 52 is the same as that of FIG. 1, namely a master latch circuit 121 and a slave latch circuit 122 is cascaded, the clock input CK of the double-path flip-flop 52 is connected, on one hand, to the clock input C of the master latch circuit 121 and, on the other hand, through the inverter 123 to the clock input C of the slave latch circuit 122. Data input D and scan input SI of the double-path flip-flop 52 are connected to the inputs of the multiplexer 22, and the mode input *M of the double-path flip-flop 52 is connected to the selection control input of the multiplexer 22 and a first input of the AND gate 32. The second input of the AND gate 32 is connected to the non-inverted output Q of the slave latch circuit 122 and the scan output SO of the double-path flip-flop 52. The output of the AND gate 32 is connected, on one hand, to the non-inverted output Q of the double-path flip-flop 52 and, on the other hand, to the inverted output *Q of the double-path flip-flop 52 through an inverter 521.

Referring back to FIG. 4, the configuration of the semiconductor integrated circuit 10C is the same as that of the first embodiment with the exception that signals from the inverted outputs *Q of the double-path flip-flops 52 to 55 are provided to the combinational circuit 11.

Fourth Embodiment

Figure 6:
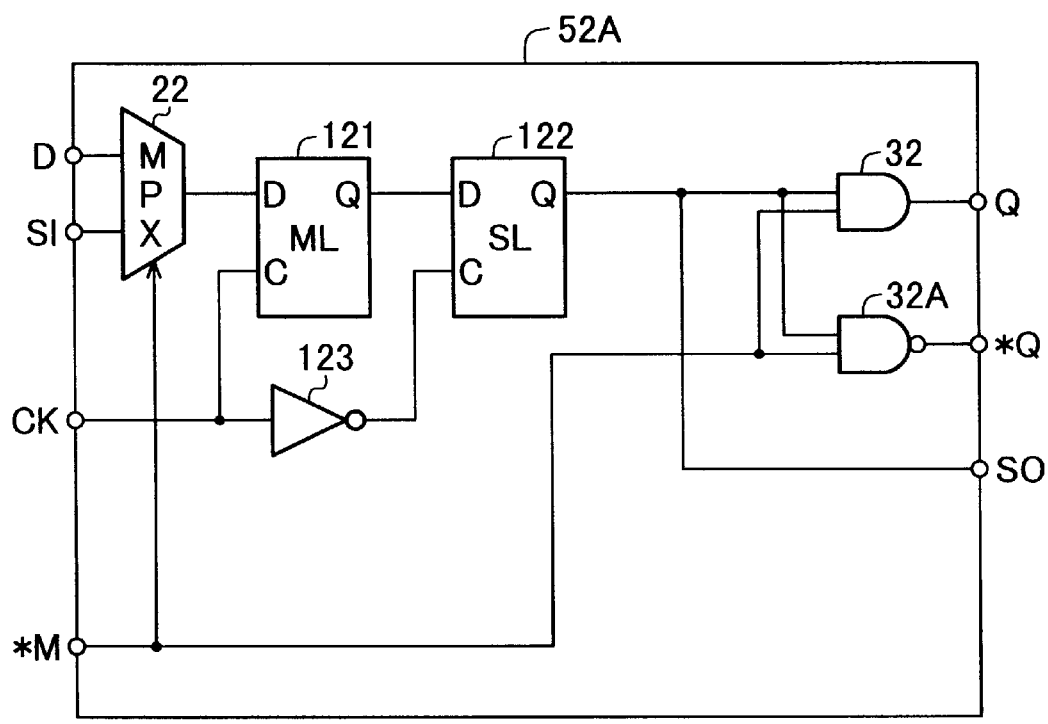
FIG. 6 is a logic circuit diagram showing a double-path flip-flop of a fourth embodiment according to the present invention.

FIG. 6 shows the configuration of a double-path flip-flop 52A employed in the sequential circuit of FIG. 4, of the fourth embodiment according to the present invention.

In this circuit, a NAND gate 32A is employed instead of the inverter 521 of FIG. 5. A first input of the NAND gate 32A is connected to the non-inverted output Q of the slave latch circuit 122 and the second input thereof is connected to the mode input *M of the double-path flip-flop 52A.

The other points in configuration are the same as that of FIG. 5.

In the normal operating mode, the mode input *M is set high, the AND gate 32 and the NAND gate 32A are opened, and the NAND gate functions as an inverter, therefore the same operations as that in the circuit of FIG. 5 are performed.

In the scan mode, the mode input *M is set low, the AND gate 32 and the NAND gate 32A are closed, and outputs of the AND gate 32 and the NAND gate 32A go low and high, respectively, independent of a change in output of the slave latch circuit 122, therefore the same operations as that of the circuit of FIG. 5 are performed.

Fifth Embodiment

Figure 7:
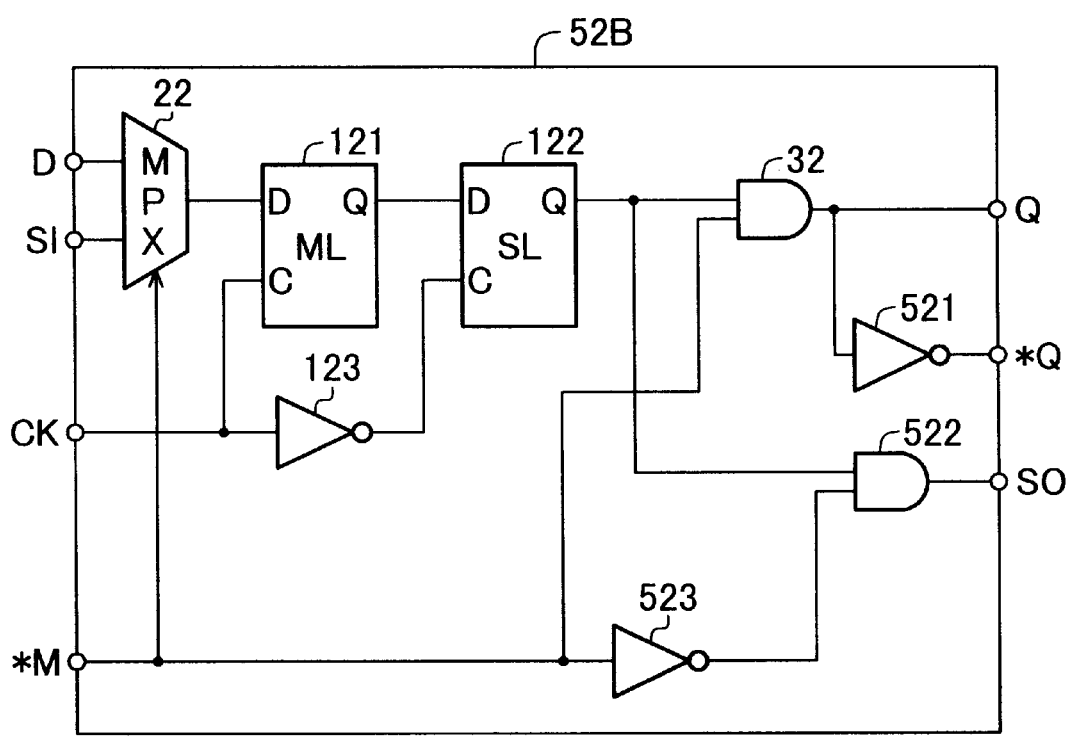
FIG. 7 is a logic circuit diagram showing a double-path flip-flop of a fifth embodiment according to the present invention.

FIG. 7 shows the configuration of a double-path flip-flop 52B employed in the sequential circuit of FIG. 4, of the fifth embodiment according to the present invention.

In this circuit, an AND gate circuit 522 and an inverter 523 are added to the circuit of FIG. 5 and the output of the slave latch circuit 122 is provided to the scan output SO through the AND gate 522. To the other input of the AND gate 522, a signal of the mode input *M is provided through the inverter 523.

The other points in configuration are the same as that of FIG. 5.

In the normal operating mode, the mode input *M is set high, the AND gate 522 is closed, the scan output SO is kept low, independent of a change of a signal of the clock input CK and the same operations as that in the case of FIG. 2 are performed.

In the scan mode, the mode input *M is set low, the AND gate 522 is opened and the same operations as that in the case of FIG. 5 are performed.

Sixth Embodiment

In FIG. 4, the double-path flip-flops 52 to 55 are generally disposed here and there in a semiconductor integrated circuit 10C. When the clock CLK is provided commonly to clock inputs C thereof, there may be a timing error since the edge of the clock CLK arrives at the clock inputs C at different times.

Figure 8:
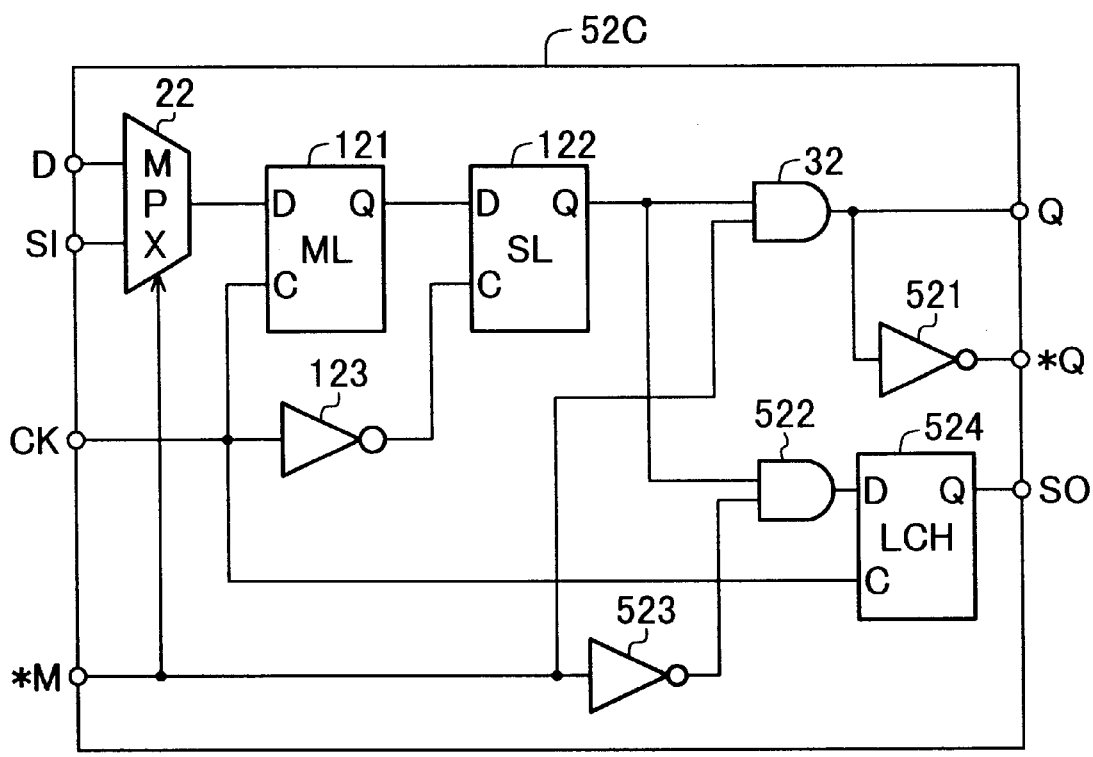
FIG. 8 is a logic circuit diagram showing a double-path flip-flop of a sixth embodiment according to the present invention.

In the sixth embodiment according to the present invention, in order to prevent such a timing error, a latch circuit 524, as shown in FIG. 8, is connected between the output of the AND gate 522 and the scan output SO of a double-path flip-flop 52C, and the clock input C thereof is connected to the clock input CK of the double-path flip-flop 52C. The other points in configuration are the same as that of FIG. 7.W With the above configuration, since in the scan mode, the output of the AND gate 522 is pre-latched in the latch circuit 524 in the neighborhood of the gate 522, the timing error is prevented from occurring.

Since a signal propagation on the scan path is delayed by the latch circuit 524, the number of clock cycles are set to 3/2 times one in the case where the latch circuit 524 is not used.

Seventh Embodiment

Figure 9:
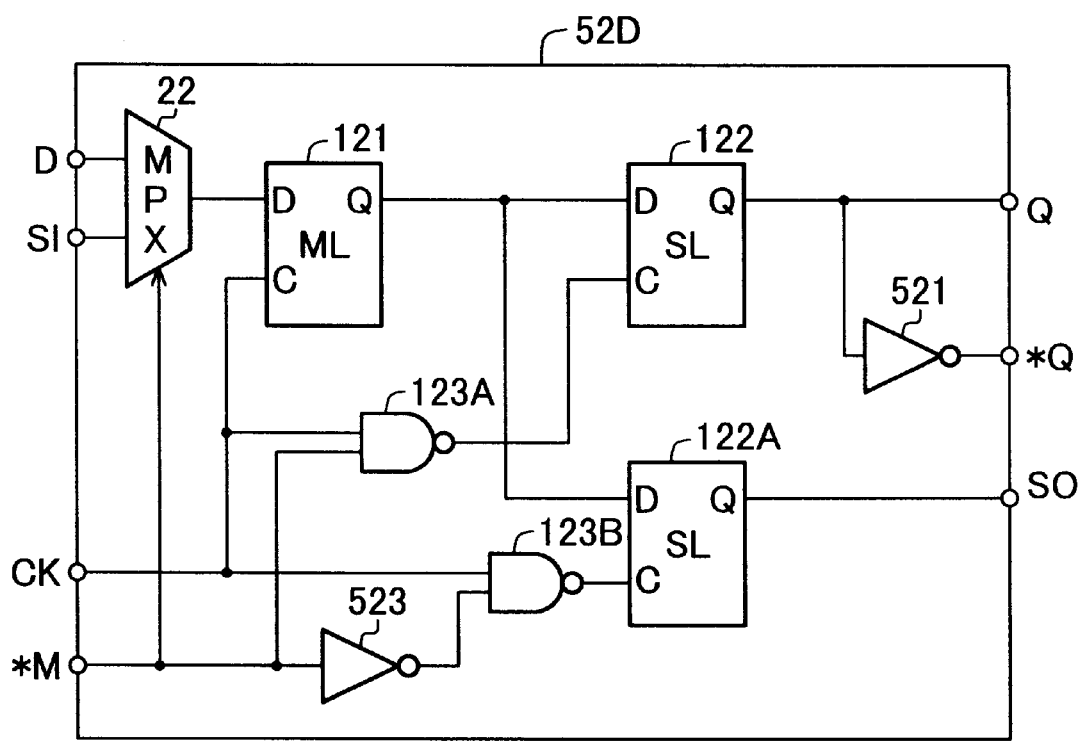
FIG. 9 is a logic circuit diagram showing a double-path flip-flop of a seventh embodiment according to the present invention.

FIG. 9 shows the configuration of a double-path flip-flop 52D employed in the sequential circuit of FIG. 4, of the seventh embodiment according to the present invention.

In this circuit, the AND gate 32 of FIG. 7 is omitted and a NAND gate 123A is employed instead of the inverter 123 of FIG. 7. The inputs of the NAND gate 123A are connected to the clock input CK and the mode input *M of the double-path flip-flop 52D. In the scan mode where the mode input *M is low, the NAND gate 123A is closed and no clock is provided to the clock input C of the slave latch circuit 122. Thereby, since a non-inverted output Q of the double-path flip-flop 52D does not change, the same effect as that in the case of FIG. 1 can be achieved.

Further, a slave latch circuit 122A on the scan path is connected in parallel to the slave latch circuit 122 on the normal path. The data input D and the non-inverted output Q of the slave latch circuit 122A are connected to the non-inverted output Q of the master latch circuit 121 and the scan output SO of the double-path flip-flop 52D, respectively. To the clock input C of the slave latch circuit 122A, the clock input CK of the double-path flip-flop 52D is connected through a NAND gate 123B. To the other input of the NAND gate 123B, the mode input *M of the double-path flip-flop 52D is connected through an inverter 523.

In the normal operating mode where the mode input *M is high, since the NAND gate 123B is closed, a clock is not sent to the clock input C of the slave latch circuit 122A and a signal of the scan output SO does not change, therefore useless power consumption in the sequential circuit can be decreased. Further, the NAND gate 123A functions as an inverter and the master latch circuit 121 and the slave latch circuit 122 function as a flip-flop on the normal path.

In the scan mode where the mode input *M is low, the NAND gate 123B functions as an inverter and the master latch circuit 121 and the slave latch circuit 122A function as a flip-flop on the scan path. The NAND gate 123A is closed, no clock is sent to the clock input C of the slave latch circuit 122 and the outputs Q and *Q of the double-path flip-flop 52D do not change, therefore useless power consumption in the combinational circuit 11 of FIG. 4 can be decreased.

Eighth Embodiment

Figure 10:
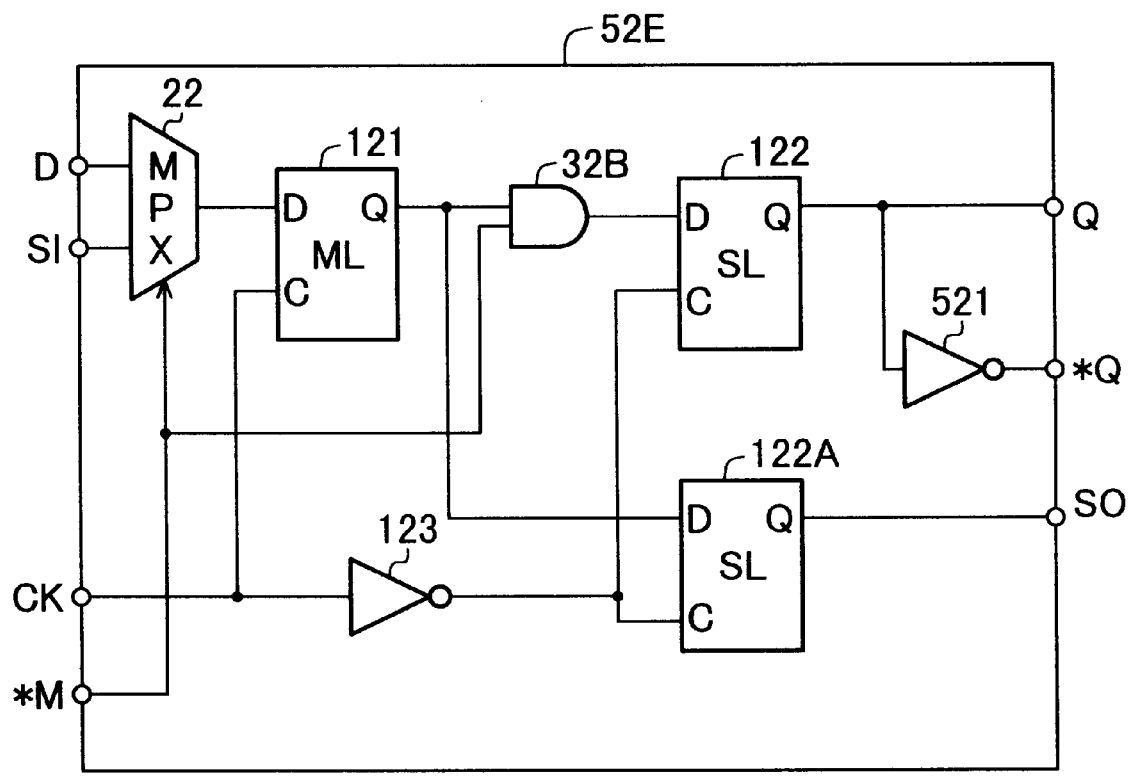
FIG. 10 is a logic circuit diagram showing a double-path flip-flop of a eighth embodiment according to the present invention.

FIG. 10 shows the configuration of a double-path flip-flop 52E employed in the sequential circuit of FIG. 4, of the eighth embodiment according to the present invention.

In the scan mode in FIG. 9, a clock on the normal path is blocked by the NAND gate 123A so as not to change the output of the normal path, while data of the normal path in FIG. 10 is blocked by the AND gate 32B and thereby, the same function is achieved.

That is, in the double-path flip-flop 52E, an AND gate 32B is connected between the non-inverted output Q of the master latch circuit 121 and the data input D of the slave latch circuit 122, and the other input of the AND gate 32B is connected to the mode input *M of the double-path flip-flop 52E. With such a configuration, since when the mode input *M is low, no data is sent from the master latch circuit 121 to the slave latch circuit 122 and the output of the AND gate 32B remains low, the non-inverted output Q of the double-path flip-flop 52E remains low.

The master latch circuit 121, the slave latch circuit 122A and the inverter 123 function as a flip-flop on the scan path.

Ninth Embodiment

Figure 11:
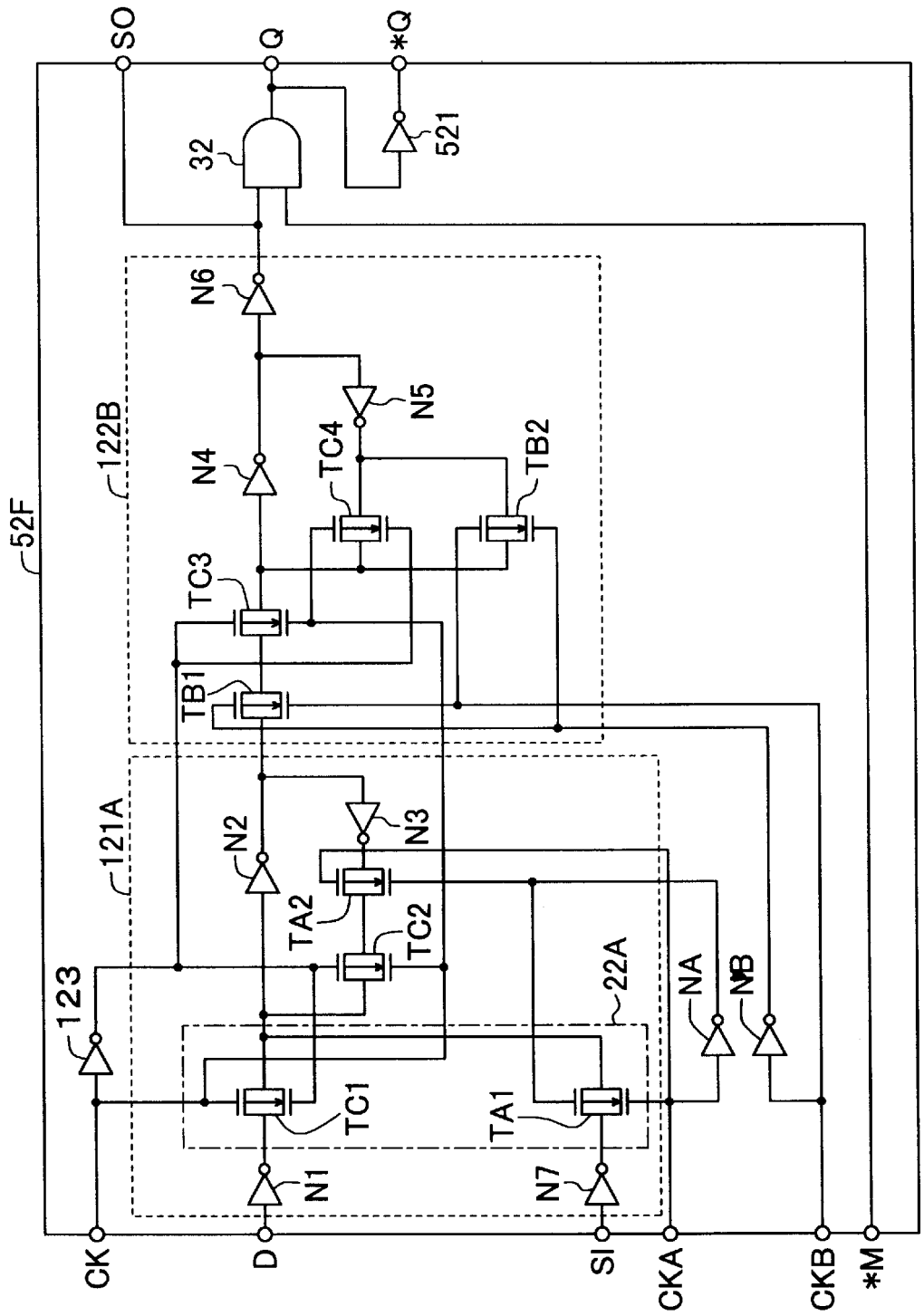
FIG. 11 is a logic circuit diagram showing a double-path flip-flop of a ninth embodiment according to the present invention.

FIG. 11 shows the configuration of a double-path flip-flop 52F employed in the sequential circuit of FIG. 4, of the ninth embodiment according to the present invention.

The circuit 52F is configured with prior art elements except the AND gate 32 and the inverter 521, wherein N1 to N7, and NA and NB are inverters, and TC1 to TC4, TA1 and TA2, and TB1 and TB2 are transfer gates each constructed by connecting an NMOS transistor and a PMOS transistor in parallel.

The double-path flip-flop 52F is similar to the circuit of FIG. 5, and a master latch circuit 121A, a slave latch circuit 122B and a multiplexer 22A in the input stage of the master latch circuit 121A correspond to the circuits 121, 122 and 22, respectively, of FIG. 5. The multiplexer 22A is constructed of a transfer gate TA1 and a transfer gate TC1 of the master latch circuit. To the control input of the multiplexer 22A, the clock inputs CK and CKA of the double-path flip-flop 52F are connected, and the mode input *M is connected only to the input of the AND gate 32.

In the normal operating mode, the mode input *M is set high, and the AND gate 32 is opened. Further, the shift clocks CKA and CKB are fixed low and high, respectively, the transfer gates TA1 and TB2 are off, the transfer gates TA2 and TB1 are on, and the master latch circuit 121A, the slave latch circuit 122B and the multiplexer 22A are in the same states as those of the circuits 121, 122 and 22, respectively, of FIG. 5. That is, the data D is selected at the multiplexer 22A, the master latch circuit 121A and the slave latch circuit 122B are operative by a clock from the clock input CK and the normal path is effective while the scan path is ineffective.

In the scan mode, the mode input *M is set low and the AND gate 32 is closed. Further, the clock input CK is fixed high, the transfer gates TC1 and TC2 are off, the transfer gates TC2 and TC3 are on and thereby, the scan path is effective while the normal path is ineffective. That is, the scan input SI is selected at the multiplexer 22A, and the master latch circuit 121A and the slave latch circuit 122B are operative by clocks from the respective shift clock inputs CKA and CKB. If no timing error occurs, shift clocks of opposite phases are only required to be provided to the shift clock inputs CKA and CKB.

Although preferred embodiments of the present invention has been described, it is to be understood that the invention is not limited thereto and that various changes and modifications may be made without departing from the spirit and scope of the invention.

For example, in FIG. 1, if at least one of the AND gates 32 to 34 is used, the effect according to the present invention can be achieved.

The circuit of FIG. 11 may be replaced with a circuit in which a modification is made like any one of FIGS. 6 to 11.

Further, a scan path may be configured with part of a sequential circuit in a semiconductor integrated circuit. An output of a flip-flop of a sequential circuit may be provided to another flip-flop of the sequential circuit only through wiring in a combinational circuit.

Still further, various kinds of double-path flip-flops such as described above may be included in a sequential circuit and a scan path may be constructed using these flip-flops.

What is claimed is:

1. A semiconductor integrated circuit comprising a logic circuit, said logic circuit including a combinational circuit and a sequential circuit, said sequential circuit including a plurality of flip-flops and having normal and scan paths made selectively effective by a scan mode signal, said normal and scan paths being constructed in such a way that, when said scan mode signal is inactive, said flip-flops receive output data of said combinational circuit through respective multiplexers on input sides or in input stages of said flip-flops, and when said scan mode signal is active, said flip-flops are cascaded through said multiplexers to form a shift register, said semiconductor integrated circuit further comprising:

a gate circuit for preventing an output of at least one of said flip-flops from being transmitted to said combinational circuit when said scan mode signal is active.

2. A semiconductor integrated circuit according to claim 1, wherein at least one of said flip-flops comprises:

a master latch circuit, having a data input to receive an output of corresponding one of said multiplexers; and a slave latch circuit, having a data input to receive an output of said master latch circuit, wherein said gate circuit has a first input to receive an output of said slave latch circuit, a second input to receive said scan mode signal, and an output to provide a signal to said combinational circuit.

3. A semiconductor integrated circuit according to claim 1, wherein at least one of said flip-flops comprises:

a master latch circuit, having a data input to receive an output of corresponding one of said multiplexers; and a slave latch circuit, having a data input to receive an output of said master latch circuit, wherein said gate circuit has a first input to receive an output of said master latch circuit, a second input to receive said scan mode signal, and an output to provide said data input of said slave latch circuit with the signal at said first input when said scan mode signal is inactive, and with a constant signal independent of the signal at said first input when said scan mode signal is active.

4. A semiconductor integrated circuit comprising a logic circuit, said logic circuit including a combinational circuit and a sequential circuit, said sequential circuit including a plurality of flip-flops and having normal and scan paths made selectively effective by a scan mode signal, said normal and scan paths being constructed in such a way that, when said scan mode signal is inactive, said flip-flops receive output data of said combinational circuit through respective multiplexers on input sides or in input stages of said flip-flops, and when said scan mode signal is active, said flip-flops are cascaded through said multiplexers to form a shift register, said semiconductor integrated circuit further comprising:

a gate circuit for preventing an output of at least one of said flip-flops from being transmitted to succeeding one of said multiplexers when said scan mode signal is active.

* * * * *